United States Patent [19]

Brown et al.

[11] Patent Number: 4,923,716
[45] Date of Patent: May 8, 1990

[54] CHEMICAL VAPOR DESPOSITION OF SILICON CARBIDE

[75] Inventors: Duncan W. Brown, Wilton, Conn.; James D. Parsons, Newbury Park, Calif.

[73] Assignee: Hughes Aircraft Company, Los Angeles, Calif.

[21] Appl. No.: 248,651

[22] Filed: Sep. 26, 1988

[51] Int. Cl.$^5$ .................. C23C 16/00; C01B 31/36
[52] U.S. Cl. .................. 427/249; 427/255.1; 427/255.2; 423/345
[58] Field of Search .................. 427/248.1, 249, 255.1, 427/255.2; 423/345, 346; 428/698

[56] References Cited
U.S. PATENT DOCUMENTS 4,459,338 7/1984 Angelini et al. ............... 427/249
4,810,526 3/1989 Ito et al. ........................ 427/249

FOREIGN PATENT DOCUMENTS 63-201010 8/1988 Japan ..................... 423/345

*Primary Examiner*—Norman Morgenstein
*Assistant Examiner*—Margaret Bueker
*Attorney, Agent, or Firm*—P. M. Coble; W. K. Denson-Low

[57] ABSTRACT

Silicon carbide is deposited by chemical vapor deposition from a vapor source having a single molecular species that provides both the silicon and the carbon. The molecular species has the composition $C_nSi_nH_m$, where m ranges from $2n+1$ to $4n+1$ inclusive and n ranges from 2 to 6 inclusive, and exhibits a primary pyrolysis mechanism producing reactive fragments containing both silicon and carbon atoms. Unbalanced decomposition paths are avoided. The silicon and carbon atoms are necessarily codeposited in equal numbers and at equal rates onto the substrate, producing stoichiometric deposited silicon carbide. Preferred molecular sources include $H_3SiCH_2CH_2SiH_3$, a silacycloalkane of the form $(-SiH_2CH_2-)_p$, where p is 2, 3, 4, or 5, and a cyclic structure of the form $(-SiH(CH_3)-)_q$, where q is 4 or 5.

15 Claims, 2 Drawing Sheets

CHEMICAL VAPOR DESPOSITION OF SILICON CARBIDE

BACKGROUND OF THE INVENTION

This invention relates to the deposition of layers onto substrates, and, more particularly, to chemical vapor deposition of silicon carbide.

An extensive technology of semiconductor devices has been developed based upon the properties of single crystal silicon and other similar materials which may be doped, heat treated, and otherwise processed to produce adjacent layers and regions of varying electronic characteristics. The use of devices produced by silicon technology is generally limited to operation at ambient or, at most, moderately elevated temperatures and in non-corrosive, inert atmospheres. The temperature limitation is a consequence of the rapid diffusion of dopants or impurity species in the silicon, which in turn can substantially alter the character of the fabricated semiconductor device. The limitation to relatively inert environments results from the high chemical reactivity of silicon in many corrosive environments, which also can alter the character of the fabricated device. Silicon devices are also limited as to power level, frequency, and radiation tolerance by the materials used therein.

For some applications, the temperature, environmental, and other use limitations on silicon devices may be overcome by the use of proper cooling and packaging techniques. In other applications, these limitations have prevented the use of silicon for integrated circuit technology. For example, in many spacecraft and aircraft applications, elevated temperatures are encountered, and it is not always possible to insure that adequate cooling will be provided. In high power applications, internal thermal transients in devices otherwise operating at ambient temperature can rapidly destroy the operability of the device unless extensive cooling is provided. Such cooling requires that the device be larger in size that might otherwise be necessary, in part defeating the purpose of the integrated circuit technology.

There has therefore been an ongoing, but as yet not fully successful, search over a period of twenty years to identify and develop a semiconductor technology based in other materials. Such a technology would desirably allow the fabrication of devices for use at higher temperatures such as, for example, the range of at least about 400 C. to 600 C., and in applications not amenable to the use of silicon. Because corrosive effects can be greatly accelerated at elevated temperatures and pressures, any such materials and devices must also exhibit excellent corrosion resistance at the elevated use temperatures and over a range of pressures from vacuum to many atmospheres. Some generally desirable characteristics of such materials have been identified, including large band gap, good electrical conductivity, high breakdown electric field, low dielectric constant, ability to be doped to produce regions of varying electronic characteristics, a high melting temperature, good strength at operating temperatures, resistance to diffusion by undesired foreign atoms, good thermal conductivity, thermal stability, chemical inertness, and the ability to form ohmic external contacts.

Silicon carbide, particularly in its beta-phase form having a zincblende cubic crystallographic structure, has been identified as a candidate material meeting the indicated requirements. Silicon carbide has a high melting point, good strength, good resistance to radiation damage, and good corrosion resistance in many environments. Silicon carbide has a high breakdown voltage, a relatively large band gap, low dielectric constant, and a thermal conductivity of more than three times that of silicon at ambient temperature. Silicon carbide is also resistant to the diffusion of impurity species. Silicon carbide may be processed by several techniques similar to those used in silicon device technology, and in many instances silicon carbide devices may be substituted at moderate and low temperatures for silicon devices. Silicon carbide semiconductor device technology therefore offers the opportunity for supplementing, and in some instances replacing, conventional silicon device technology.

Silicon carbide may be formed or deposited by many techniques, one of which is chemical vapor deposition (CVD). In CVD, the species to be deposited are initially provided in a molecularly combined form. These molecules are selected to have a sufficiently high vapor pressure that they can be evaporated and transported in the vapor phase to a heated substrate. At the substrate, the molecules decompose by pyrolysis, depositing the species of interest on the substrate. Chemical vapor deposition is a particularly desirable fabrication approach, as it permits the controlled growth of undoped and doped layers and structures of a variety of forms.

Thus, in one common approach for depositing silicon carbide onto a substrate, silane ($SiH_4$) is selected as the source of silicon, and n-hexane ($C_6H_{14}$) or methane ($CH_4$) is selected as the source of carbon. A mixture of these two gases in a hydrogen carrier gas is passed over a substrate maintained at a temperature of about 1400 C. Silicon carbide is deposited upon the substrate as the silicon-containing species and the carbon-containing species pyrolyze at the substrate.

This approach is operable in depositing silicon carbide, but cannot be controlled with sufficient precision to ensure that beta silicon carbide of stoichiometric composition, free of excess silicon or carbon, can be reproducibly deposited at different times of the same deposition run, or on different deposition runs. The principal difficulty is that absolutely reproducible flows of the source gases cannot be provided with existing gas flow control equipment.

Several approaches have been tried in the search for a solution to this problem. The very finest gas flow control equipment has been used in the CVD systems, but small disparities remain between successive deposited films. Sources in which the silicon and carbon are provided in a single molecule have been tried, but the deposited silicon carbide has been either silicon rich or carbon rich—it has proved impossible to obtain reproducibly precise stoichiometric compositions.

Accordingly, there exists a need for an improved process for depositing beta silicon carbide by chemical vapor deposition. Such a process should function by the basic CVD approach, but should result in stoichiometric, unpolytyped beta silicon carbide. The present invention fulfills this need, and further provides related advantages.

SUMMARY OF THE INVENTION

There is provided a chemical vapor deposition process for depositing silicon carbide. The process is inherently highly reproducible, yet retains the advantages of CVD generally in that precisely controlled doping is possible when desired. System limitations requiring highly precise mass flow controllers are eliminated, resulting in a much simpler and less expensive flow control system. The silicon carbide produced by this process is unpolytyped, stoichiometric beta silicon carbide without excess silicon or carbon. It is deposited rapidly and reproducibly at a growth temperature lower than that generally used in prior approaches.

In accordance with the inevention, a process for depositing beta silicon carbide on a substrate at a deposition temperature comprises the steps of furnishing a deposition source vapor which contains both silicon and carbon atoms in a single molecule, the source vapor having the molecular composition $C_nSi_nH_m$, where m ranges from $2n+1$ to $4n+2$ inclusive and n ranges from 2 to 6 inclusive, and where the source vapor molecule has a primary pyrolysis decomposition path, at the deposition temperature, which produces unsaturated molecules containing equal numbers of silicon and carbon atoms and deposits silicon carbide upon the substrate, and has no substantial unbalanced decomposition path producing silicon and carbon with substantially different deposition reactivities; and contacting the deposition source vapor to the substrate at the deposition temperature.

One exemplary type of unsaturated molecule produced during decomposition has multiple bonds (double or triple bonds) linking the carbon and silicon atoms, which resist decomposition in the gas phase. Another exemplary type of unsaturated molecule contains divalent silicon with only two substituents. All of these structures are resistant to gas-phase decomposition of the linked silicon and carbon atoms, so that instead the hydrogen atoms are stripped away in the gas phase or upon deposition so that linked silicon and carbon atoms are deposited in equal numbers.

The silicon and carbon are deposited from a single molecular source species, eliminating the need for precisely controlling the relative amounts of two or more species. The composition of the source species may be expressed by the form $C_nSi_nH_m$, where m ranges from $2n+1$ to $4n+2$ inclusive and n ranges from 2 to 6 inclusive. As used herein, this general form is a shorthand notation indicating that the source species contains only carbon, silicon, and hydrogen atoms, that the number of carbon and silicon atoms is the same, and that the number of hydrogen atoms falls in the indicated limits. This general form should not be taken to suggest any particular structure for the source, as both linear and cyclic molecular structures have been found satisfactory. The term "inclusive" used in conjunction with a range of values means that both end points of the range are included in the recitation.

The decomposition path is primarily through an unsaturated molecule, which permits the hydrogen atoms to be released first upon deposition, so that the silicon and carbon are deposited as a stoichiometric unit onto the substrate. There can be neither an excess of silicon nor an excess of carbon in this approach. There are substantially no unbalanced decomposition paths during pyrolysis, a limitation eliminating several otherwise attractive candidate materials because they can decompose by a path that permits deposition of unequal numbers of silicon and carbon. An unbalanced decomposition path produces structures having silicon and carbon with substantially different reactivities, with the result that different numbers of the atoms are deposited. In requiring a "substantial" absence of unbalanced decomposition, it is understood that such paths may be possible or observed in very small amounts, as on the order of 1-2% or less of the total decomposition product, and are tolerated in such small amounts. A larger amount of reaction product produced by an unbalanced decomposition, as more than about 5% of the total molecular decomposition, results in a deposited composition that deviates significantly from beta silicon carbide stoichiometry and is therefore undesirable.

The present approach produces deposits of beta silicon carbide that are precisely stoichiometric, with neither silicon nor carbon in excess. Doping is normally accomplished by introducing a second gaseous species containing the dopant, in a small amount in the gas stream. The process is reproducible within a single deposition run, or between different runs. Relatively inexpensive apparatus is required, and in fact conventional chemical vapor deposition apparatus is operable. Other features and advantages of the present invention will be apparent from the following more detailed description, taken in conjunction with the accompanying drawings, which illustrate, by way of example, the principles of the invention.

DETAILED DESCRIPTION OF THE INVENTION

Figure 1:
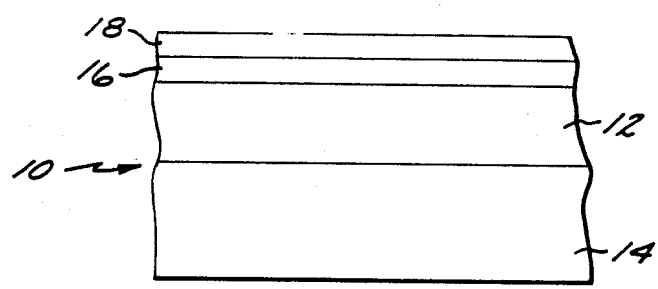
FIG. 1 is an elevational view of a deposited silicon carbide film.

In addition to that recited above, the approach of the invention may be expressed in several other ways. In another embodiment, a process for depositing beta silicon carbide on a substrate at a deposition temperature comprises the steps of furnishing a deposition source vapor which contains both silicon and carbon in a single molecule, the source vapor having the molecular formula $C_nSi_nH_m$, where m ranges from $2n+1$ to $4n+2$ inclusive and n ranges from 2 to 6 inclusive, and where the source vapor molecule delivers silicon and carbon atoms to the substrate in equal numbers and with each in a reactive form at the deposition temperature; and contacting the deposition source vapor to the substrate at the deposition temperature.

The process may be expressed in terms of intermediates produced during pyrolysis of the source species. In accordance with that approach, a process for depositing beta silicon carbide on a substrate at a deposition temperature comprises the steps of furnishing a deposition source vapor which contains both silicon and carbon in a single molecule, the source vapor having the molecular composition $C_nSi_nH_m$, where m ranges from $2n+1$ to $4n+2$ inclusive and n ranges from 2 to 6 inclusive, and the deposition source vapor produces an intermediate during pyrolysis at the deposition temperature, the intermediate being selected from the group consisting of methylsilylene ($CH_3-Si-H$) and silaethene ($CH_2=SiH_2$); and contacting the deposition source vapor to the substrate at the deposition temperature.

In yet another embodiment, a process for depositing beta silicon carbide on a substrate comprises the steps of furnishing a deposition source vapor which contains equal numbers of silicon and carbon in a single molecule, the source vapor having the molecular formula $C_nSi_nH_m$, where m ranges from $2n+1$ to $4n+2$ inclusive and n ranges from 2 to 6 inclusive, and the source vapor decomposes to a molecular form having silicon and carbon in a single molecule wherein the efficiency of deposition of silicon and carbon is substantially identical; and contacting the deposition source vapor to the substrate at the deposition temperature.

In a further embodiment, a process for depositing beta silicon carbide on a substrate at a deposition temperature comprises the steps of furnishing a deposition source vapor which contains equal numbers of silicon and carbon in a single molecule, the source vapor having the molecular formula $C_nSi_nH_m$, where m ranges from $2n+1$ to $4n+2$ inclusive and n ranges from 2 to 6 inclusive, and each carbon atom is bonded to a silicon atom, and each silicon atom is bonded to a carbon atom, after pyrolysis at the deposition temperature; and contacting the deposition source vapor to the substrate at the deposition temperature.

The invention may also be expressed in terms of particularly preferred source species. In this embodiment, a process for depositing beta silicon carbide on a substrate at a deposition temperature, comprises the steps of furnishing a deposition source vapor selected from the group consisting of $H_3SiCH_2CH_2SiH_3$ (1,2-bis(silyl)ethane), $H_3SiCH=CHSiH_3$ (disilaethene), $H_3SiC \equiv CSiH_3$, $H_3SiC \equiv CSiH_3$ (disilylethyne), a silacycloalkane of the form $(SiH_2CH_2)_p$, where p is 2, 3, 4, or 5, and a cyclic structure of the form $(-SiH(CH_3)-)_q$, where q is 4 or 5; and contacting the deposition source vapor to the substrate at the deposition temperature.

A key to the present process is the discovery of molecular species that include both silicon and carbon in a single molecule, have sufficiently high vapor pressures to serve as effective CVD sources, and decompose by pyrolysis at the deposition temperature to provide reactive species that deliver silicon and carbon atoms to the deposition substrate in equal numbers. Providing the silicon and carbon atoms in a single molecule avoids the need for precisely generating and controlling two or more gas flows of different source vapors and ensuring their simultaneous arrival at the substrate.

The deposition can occur with or without the formation of intermediate species during pyrolysis. Where an intermediate species is formed, the preferred intermediate is methylsilylene ($CH_3-\ddot{S}i-H$) or silaethene ($CH_2=SiH_2$), or intermediates which are chemically similar to methylsilylene or silaethene, which have the desired strongly bonded silicon-carbon structure.

The present invention is practiced by providing a flow of the source species, usually in a carrier gas, over a substrate. The substrate is heated to a pyrolysis temperature appropriate for the particular source species, to provide energy for the pyrolysis reaction. Energy can also be provided to the substrate from other sources, such as a high frequency induction field. The single source species pyrolyzes at the surface of the substrate, depositing the silicon and carbon atoms in equal numbers to produce precisely stoichiometric beta silicon carbide. The process is highly reproducible, as only the partial pressure of the source species and the temperature must be duplicated to attain identical deposition conditions. These variables can be accurately controlled with relatively inexpensive apparatus, in contrast to the situation where relative flows of two different gaseous source species must additionally be controlled.

FIG. 1 illustrates the type of deposited structure that may be formed with the process of the invention. A semiconductor device wafer base 10 has a beta silicon carbide overlay layer 12 epitaxially deposited upon a substrate 14. The substrate 14 may be made of any suitable material, such as, for example, titanium carbide, tantalum carbide, zirconium carbide, hafnium carbide, silicon carbide, and silicon. The preferred substrate material is titanium carbide, $TiC_x$. The illustrated wafer base 10 is not itself a semiconductor device, but is typically further processed to form useful semiconductor devices therein. The present invention is preferably employed to deposit layers of silicon carbide, but also may be used to form free standing silicon carbide structures.

By way of illustration of possible approaches, a second overlay layer 16 and a third overlay layer 18 are deposited overlying the silicon carbide overlay layer 12. The second overlay layer 16 might be, for example, a layer of silicon carbide doped to be p-type or n-type. The third overlay layer 18 might be, for example, another layer of beta silicon carbide or another doped layer. A particular advantage of chemical vapor deposition is that such layered structures can be developed by simply altering the composition of the gas flow to the deposition apparatus.

Figure 2:
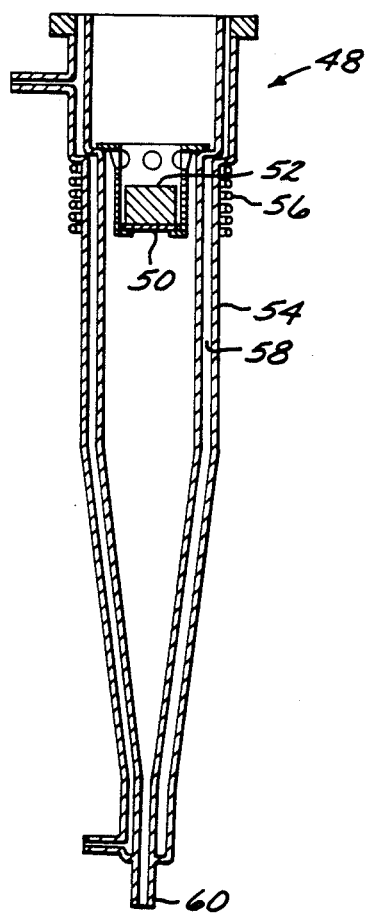
FIG. 2 is a side sectional view of a chemical vapor deposition apparatus for preparing the deposited film of FIG. 1.

The silicon carbide layer 12 is deposited upon the substrate by chemical vapor deposition (CVD). A preferred apparatus 48 for accomplishing the CVD is illustrated in FIG. 2. In the apparatus 48, the substrate 14 is attached to a graphite susceptor 52. The susceptor and attached substrate are placed into a chamber 54 within an RF (radio frequency) heater coil 56, whereby the substrate 50 is heated to the deposition temperature as the susceptor is heated. The chamber 54 is of a vertical double walled construction, and in operation cooling water is passed through the outer jacket 58. The reactive source gas is introduced through a port 60 at the lower end of the chamber 54 and contacted to the substrate 14, so that that a silicon carbide overlay layer 12 is epitaxially deposited upon the substrate 50 as a result of the pyrolysis of the source gas at the surface of the heated substrate.

Figure 3:
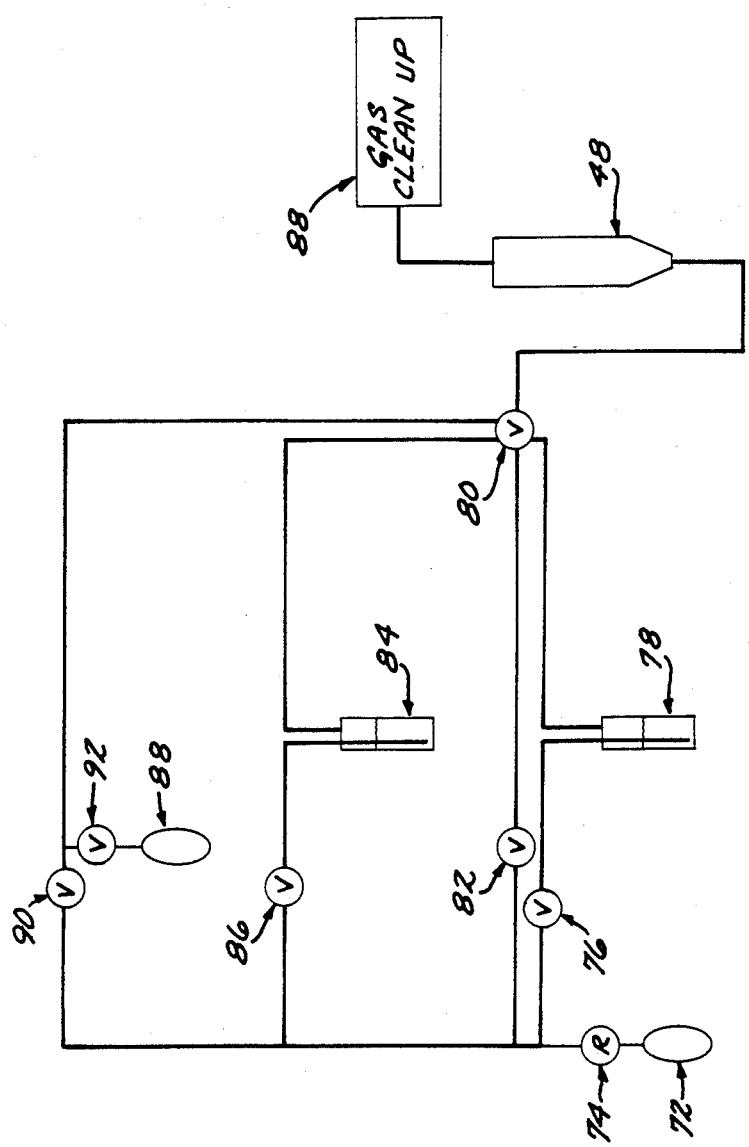
FIG. 3 is a schematic diagram of the gas management system for chemical vapor deposition.

A gas management system 70 for providing gas to the apparatus 48, and receiving the depleted gas from the apparatus 48, is illustrated in FIG. 3. A carrier gas source 72 provides carrier gas through a pressure and flow regulator 74. A flow of carrier gas, controlled by a valve 76, is bubbled through a source liquid bubbler 78 maintained at one atmosphere pressure. In this preferred form, the molecules of the source vapor are picked up by the bubbling carrier gas in the bubbler 78. The amount of carrier gas is determined by the flow rate of the carrier gas and the temperature of the liquid in the bubbler 78. The carrier gas laden with molecules of the source vapor are passed through a mixing valve 80 and thence into the apparatus 48.

The gas management system 70 also provides for the addition of an excess of the carrier gas, through another valve 82. The excess carrier gas is mixed with that portion of the carrier gas passing through the bubbler 78 at the mixing valve 80.

The gas management system 70 permits the addition of another gas to the apparatus 48. Specifically, a dopant is introduced by bubbling another portion of the carrier gas through a dopant bubbler 84, the flow of carrier gas being controlled by a valve 86. Molecules of the dopant source are picked up in the carrier gas flow, mixed at the mixing valve 80, and carried into the apparatus 48.

Another approach for providing a dopant is also illustrated in FIG. 3. Carrier gas is mixed with a gaseous dopant from a dopant source 88. The flow of carrier gas is metered by a valve 90, and the flow of dopant gas is metered by a valve 92. This approach is used where the dopant is a gas at about ambient temperature, rather than a liquid or solid.

After gas has completed its passage through the apparatus 48, it is depleted of a portion of the molecules of source gas vapor and dopant gas vapor, if any. Appropriate gas cleanup apparatus 94 is provided to clean the depleted gas stream to environmentally acceptable standards.

In the illustrated preferred approach, the silicon carbide source gas and dopant source gas are introduced with a bubbler. The source gases can be provided in any other convenient manner. The source material can also be provided in a solid form, and the carrier gas passed over it, for example. The source materials are selected to have an appropriately high vapor pressure, so that they can be readily and controllably introduced into the apparatus 48.

An important advantage of the present approach is apparent from an inspection of the system 70. There are not separate sources for a silicon containing source gas and a carbon containing source gas, as both are supplied from a single gas in the bubbler 78. In past practice, the silicon and carbon have been typically supplied from different sources, and their precise, reproducible mixing has been beyond even the most sophisticated gas control systems, if deposition of stoichiometric beta silicon carbide was the objective.

Typical operating conditions of the apparatus 48 for deposition of beta silicon carbide from the preferred source vapor disilylethane are a substrate temperature of 1200–1400 C., and a gas flow of a mixture of 1–10 sccm (standard cubic centimeters per minute) of hydrogen carrier gas bubbled through disilylethane at 0 C., the total pressure within the apparatus 48 being about 1 atmosphere. The deposition rate of the silicon carbide under these operating conditions varies approximately linearly with the flow rate of the carrier gas through the bubbler 78. The growth rate of the silicon carbide layer 12 has been measured to be about 0.6 micrometers per hour for each standard cubic centimeter per minute of hydrogen carrier gas flow, over the range 1–12 sccm hydrogen flow. These precise operating conditions are not required, however, and may be varied over a range without adversely affecting the quality of the deposited layer.

The preferred source materials are 1,2-disilylethane (also sometimes known as 1,2-bis(silyl)ethane), disilylethene, disilylethyne, a silacycloalkane of the form $(SiH_2CH_2)_p$, where p is 2, 3, 4, or 5, and a cyclic structure of the form $(CH_3SiH)_q$, where q is 4 or 5. Disilylethane has a chemical formula of $H_3SiCH_2CH_2SiH_3$. Disilylethyne has a chemical formula of $H_3SiC{\equiv}CSiH_3$. Of these preferred source materials, 1,2-disilylethane is the most preferred.

It is believed that the decomposition of each of these molecules upon pyrolysis involves an intermediate molecule wherein the silicon and carbon are bonded together in an unsaturated molecule. In each case, the pyrolysis path involves unsaturated intermediates chemically similar to methylsilylene ($CH_3{-}\ddot{Si}{-}H$) or silaethene ($CH_2{=}SiH_2$). These unsaturated compounds resist the rupture of the silicon-carbon bond in the gas phase. The pyrolysis path thus involves loss of hydrogen, leaving the silicon and carbon to deposit upon the surface of the substrate. Silicon and carbon atoms are delivered to the substrate in equal numbers, with substantially equal reactivity.

There are no unbalanced decomposition paths, in which silicon and carbon are delivered to the substrate in unequal numbers or with substantially different chemical reactivities. This characteristic of the pyrolysis is important, because it prevents the production of minor fractions of deposition of unequal numbers of silicon and carbon. At levels of greater than about 5% of the total deposited silicon carbide, an unbalanced deposition results in a significant deviation from the beta silicon carbide stoichiometry having exactly equal numbers of silicon and carbon.

An example illustrates this limitation. Methylsilane, $CH_3SiH_3$, would otherwise be an attractive candidate material for the present process. However, about 5–8% of the methylsilane decomposes along an alkane elimination path to yield a mixture of silylene, $:SiH_2$, and methane, $CH_4$, wherein the silicon is substantially more reactive than the carbon. The result is deposition of a silicon-rich product that is not pure stoichiometric beta silicon carbide. Another candidate material, dimethyldisilane, $(CH_3SiH)_2$, suffers from the same problem. Neither of these materials is acceptable as a source for monomolecular deposition of beta silicon carbide.

It is expected that unbalanced decomposition paths may be possible for nearly all source vapors. Calculations suggest that decomposition of 1–2% or less of the source vapor along an unbalanced path is tolerated, while amounts of 5% or more are not tolerated. Intermediate amounts may or may not be tolerated, depending upon the specific use to be made of the deposited silicon carbide.

In the most preferred approach for practicing the invention, silicon carbide is deposited upon a titanium carbide ($TiC_x$) substrate of (001) crystallographic orientation, using the apparatus 14 of FIG. 2. The substrate is maintained at a temperature of from about 1100 to about 1400 C., most preferably about 1300 C. The gas flow to the apparatus is a mixture of disilylethane mixed with hydrogen carrier gas, produced by bubbling hydrogen through liquid disilylethane maintained at 0 C., at a flow rate of 1–10 sccm. Under these operating conditions, beta silicon carbide is deposited at a rate of about 0.7–7 micrometers per hour. The beta silicon carbide is equiatomic in silicon and carbon, without an excess of either, and is epitaxially related to the substrate.

The following examples are presented to illustrate embodiments of the invention, and should not be taken as limiting the invention in any respect.

EXAMPLE 1

The apparatus of FIG. 2 and the gas management system of FIG. 3 were used to deposit undoped beta silicon carbide upon a (001) titanium carbide substrate. The temperature of the substrate was varied between 1200 C. and 1400 C., without a noticeable effect upon deposition. Hydrogen carrier gas was bubbled through liquid 1,2-disilylethane maintained at 0 C. The total gas pressure was 1 atmosphere, and the flow rate of the hydrogen was varied from 1 to 10 sccm. Diluent hydrogen gas was also introduced along with the hydrogen bubbled through the bubbler to collect 1,2-disilylethane, for a total gas flow of about 2900 sccm. Beta silicon carbide was deposited over the entire range of flow rate and temperature. The growth rate of the silicon carbide was linearly related to the flow rate of hydrogen through the bubbler over the range studied. The beta silicon carbide growth rate was about 0.6 micrometers per hour, for each sccm of hydrogen flow through the bubbler.

EXAMPLE 2

The undoped beta silicon carbide prepared in accordance with Example 1 was measured to have an n-type carrier concentration of about $5 \times 10^{16}$ per cubic centimeter. This concentration is believed to be due to background nitrogen donors.

EXAMPLE 3

Beta silicon carbide with p-type doping was prepared using the same approach as described in Example 1, except that a dopant source gas was mixed with the silicon carbide source gas and diluent gas. In this example, the hydrogen flow through the 1,2-disilylethane silicon carbide source liquid was 10 sccm. A separate hydrogen flow of 1 sccm was bubbled through liquid trimethylaluminum maintained at 20 C., so that trimethylaluminum vapor was transferred to the deposition chamber along with the 1,2-disilylethane and the carrier gas. Aluminum was deposited in the beta silicon carbide as a dopant. The total gas flow was maintained at about 2900 sccm.

The dopant level was linearly related to the gas flows. For example, a doubling of the flow rate of hydrogen through the dopant source material, while maintaining constant the flow rate through the silicon carbide source, doubles the concentration of dopant in the beta silicon carbide. Doubling of the flow rate of hydrogen through the silicon carbide source bubbler, while maintaining the flow rate of hydrogen through the dopant source material bubbler, results in a halving of the concentration of the dopant.

EXAMPLE 4

The doped silicon carbide material prepared by Example 3 was measured to have a p-type carrier concentration of about $2 \times 10^{19}$ per cubic centimeter.

EXAMPLE 5

Beta silicon carbide with p-type doping was prepared using the same approach as described in Example 1, except that a dopant source gas was mixed with the silicon carbide source gas and diluent gas. In this example, the hydrogen flow through the 1,2-disilylethane silicon carbide source liquid was 10 sccm. A separate dopant flow of 1 sccm hydrogen having 46 ppm (parts per million) of $B_2H_6$ was mixed into the gas flow, so that boron was transferred to the deposition chamber. Boron was deposited in the beta silicon carbide as a dopant. The total gas flow was maintained at about 2900 sccm. The linear doping characteristics are found for this dopant, also.

EXAMPLE 6

The doped beta silicon carbide of Example 5 was measured to have a p-type carrier concentration of $1.5 \times 10^{17}$ per cubic centimeter.

EXAMPLE 7

Beta silicon carbide with n-type doping was prepared using the same approach as described in Example 1, except that a dopant source gas was mixed with the silicon carbide source gas and diluent gas. In this example, the hydrogen flow through the 1,2-disilylethane silicon carbide source liquid was 5 sccm. A separate dopant flow of 10 sccm hydrogen containing 46 ppm (parts per million) of $NH_3$ was mixed into the gas flow, so that nitrogen was transferred to the deposition chamber. Nitrogen was deposited in the beta silicon carbide as a dopant. The total gas flow was maintained at about 2900 sccm. The linear doping characteristics are found for this dopant, also.

EXAMPLE 8

The n-type carrier concentration of the doped beta silicon carbide of Example 7 was found to be about $1 \times 10^{18}$ per cubic centimeter.

The present approach produces beta silicon carbide deposited by chemical vapor deposition from a single molecular source. Complex and expensive flow controllers for two or more molecular sources (of silicon and carbon) are not required. The resulting beta silicon carbide does not have an excess of either silicon or carbon. Although a particular embodiment of the invention has been described in detail of purposes of illustration, various modifications may be made without departing from the spirit and scope of the invention. Accordingly, the invention is not to be limited except as by the appended claims.

What is claimed is:

1. A process for depositing beta silicon carbide on a substrate at a deposition temperature, comprising the steps of:

furnishing a deposition source vapor which contains both silicon and carbon in a single molecule, the source vapor having the molecular formula $C_nSi_nH_m$, where m ranges from $2n+1$ to $4n+2$ inclusive and n ranges from 2 to 6 inclusive, and where the source vapor molecule delivers silicon and carbon atoms to the substrate in equal numbers and with each in a reactive form at the deposition temperature; and contacting the deposition source vapor to the substrate at the deposition temperature.

2. The process of claim 1, wherein the deposition source vapor produces an intermediate during pyrolysis at the deposition temperature, the intermediate being selected from the group consisting of methylsilylene and silaethene.

3. A process for depositing beta silicon carbide on a substrate at a deposition temperature, comprising the steps of:

furnishing a deposition source vapor which contains both silicon and carbon atoms in a single molecule, the source vapor having the molecular composition $C_nSi_nH_m$, where m ranges from $2n+1$ to $4n+2$ inclusive and n ranges from 2 to 6 inclusive, and where the source vapor molecule has a primary pyrolysis decomposition path, at the deposition temperature, which produces unsaturated molecules containing equal numbers of silicon and carbon atoms and deposits silicon carbide upon the substrate, and has no substantial unbalanced decomposition path producing silicon and carbon with substantially different deposition reactivities; and contacting the deposition source vapor to the substrate at the deposition temperature.

4. The process of claim 3, wherein the deposition temperature is from about 1100 C. to about 1400 C.

5. The process of claim 3, wherein the unsaturated molecules produced during pyrolysis include multiple bonds.

6. The process of claim 5, wherein the multiple bond is a double bond.

7. The process of claim 5, wherein the multiple bond is a triple bond.

8. The process of claim 1, including the further step, prior to the step of contacting, of:

furnishing a second deposition source vapor including a dopant element.

9. A process for depositing beta silicon carbide on a substrate at a deposition temperature, comprising the steps of:

furnishing a deposition source vapor which contains both silicon and carbon in a single molecule, the source vapor having the molecular composition $C_nSi_nH_m$, where m ranges from $2n+1$ to $4n+2$ inclusive and n ranges from 2 to 6 inclusive, and the deposition source vapor produces an intermediate during pyrolysis at the deposition temperature, the intermediate being selected from the group consisting of methylsilylene and silaethene; and contacting the deposition source vapor to the substrate at the deposition temperature.

10. A process for depositing beta silicon carbide on a substrate at a deposition temperature, comprising the steps of:

furnishing a deposition source vapor which contains equal numbers of silicon and carbon atoms in a single molecule, the source vapor having the molecular formula $C_nSi_nH_m$, where m ranges from $2n+1$ to $4n+2$ inclusive and n ranges from 2 to 6 inclusive, and each carbon atom is bonded to a silicon atom, and each silicon atom is bonded to a carbon atom, after pyrolysis at the deposition temperature; and contacting the deposition source vapor to the substrate at the deposition temperature.

11. A process for depositing beta silicon carbide on a substrate, comprising the steps of:

furnishing a deposition source vapor which contains equal numbers of silicon and carbon atoms in a single molecule, the source vapor having the molecular formula $C_nSi_nH_m$, where m ranges from $2n+1$ to $4n+2$ inclusive and n ranges from 2 to 6 inclusive, and the source vapor decomposes to a molecular form having silicon and carbon in a single molecule wherein the efficiency of deposition of silicon and carbon is substantially identical; and contacting the deposition source vapor to the substrate at the deposition temperature.

12. A process for depositing beta silicon carbide on a substrate at a deposition temperature, comprising the steps of:

furnishing a deposition source vapor selected from the group consisting of $H_3SiCH_2CH_2SiH_3$, $H_3SiCH=CHSiH_3$, $H_3SiC\equiv CSiH_3$, a silacycloalkane of the form $(SiH_2CH_2)_p$, where p is 2, 3, 4, or 5, and a cyclic structure of the form $(-SiH(CH_3)-)_q$, where q is 4 or 5; and contacting the deposition source vapor to the substrate at the deposition temperature.

13. The process of claim 12, wherein the deposition temperature is from about 1100 C. to about 1400 C.

14. The process of claim 12, including the further step, prior to the step of contacting, of:

furnishing a second deposition source vapor including a dopant element.

15. The process of claim 12, wherein the deposition temperature is from about 1100 C. to about 1400 C.

* * * * *

UNITED STATES PATENT AND TRADEMARK OFFICE
CERTIFICATE OF CORRECTION

PATENT NO. : 4,923,716
DATED : MAY 8, 1990
INVENTOR(S) : DUNCAN W. BROWN ET AL

It is certified that error appears in the above-identified patent and that said Letters Patent is hereby corrected as shown below: ON TITLE PAGE:

The TITLE should be --CHEMICAL VAPOR DEPOSITION OF SILICON CARBIDE-- instead of "Chemical Vapor Desposition of Silicon Carbide"; and IN THE ABSTRACT, line 1, delete "deposted" and insert --deposited--

CORRECT THE ASSIGNMENT to reflect that the Assignees are both HUGHES AIRCRAFT COMPANY, LOS ANGELES, CALIFORNIA, and ADVANCED TECHNOLOGY MATERIALS, INC., NEW MILFORD, CONNECTICUT;

Column 6, line 30, after "substrate" delete "14" and insert --50--;
lines 39-40, after "substrate" delete "14" and insert --50--; and
delete "that" first occurrence;

Signed and Sealed this

Twenty-eighth Day of January, 1992

Attest:

HARRY F. MANBECK, JR.

*Attesting Officer*      *Commissioner of Patents and Trademarks*